United States Patent
Sakamoto et al.

(10) Patent No.: US 10,566,578 B2
(45) Date of Patent: Feb. 18, 2020

(54) DISPLAY DEVICE

(71) Applicant: Japan Display Inc., Tokyo (JP)

(72) Inventors: Shigeru Sakamoto, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 248 days.

(21) Appl. No.: 15/450,316

(22) Filed: Mar. 6, 2017

(65) Prior Publication Data

US 2017/0279084 A1 Sep. 28, 2017

(30) Foreign Application Priority Data

Mar. 22, 2016 (JP) ................................ 2016-057243

(51) Int. Cl.
*H01L 51/52* (2006.01)
*H01L 27/32* (2006.01)

(52) U.S. Cl.
CPC ........ *H01L 51/5284* (2013.01); *H01L 27/322* (2013.01); *H01L 27/3246* (2013.01); *H01L 27/3248* (2013.01); *H01L 27/3258* (2013.01); *H01L 27/3262* (2013.01); *H01L 27/3276* (2013.01); *H01L 27/3279* (2013.01); *H01L 51/5206* (2013.01); *H01L 51/5234* (2013.01); *H01L 51/5246* (2013.01); *H01L 51/5253* (2013.01); *H01L 51/5271* (2013.01); *H01L 51/5281* (2013.01); *H01L 2251/301* (2013.01); *H01L 2251/303* (2013.01)

(58) Field of Classification Search
CPC ............... H01L 27/322; H01L 27/3246; H01L 51/5284; H01L 51/5262; H01L 51/5275
See application file for complete search history.

(56) References Cited

U.S. PATENT DOCUMENTS 7,580,014 B2 * 8/2009 Tanaka .................. G09G 3/325
345/76
2002/0180350 A1 12/2002 Furugori et al.
2005/0073243 A1 4/2005 Yamazaki et al.
2009/0309489 A1 12/2009 Takata et al.
(Continued)

FOREIGN PATENT DOCUMENTS

| JP | 2003-017264 A | 1/2003 |
| JP | 2003-223993 A | 8/2003 |
| JP | 2004-031201 A | 1/2004 |

(Continued)

OTHER PUBLICATIONS

JP 2007-234391 A—Partial English Translation, STIC, Jul. 2019, paragraphs 0015, 0038, 0042 and 0058. (Year: 2019).*

(Continued)

*Primary Examiner* — Jose R Diaz

(74) *Attorney, Agent, or Firm* — Michael Best & Friedrich LLP

(57) ABSTRACT

A display device includes a first substrate, a coloring layer formed on the first substrate, a transparent insulating layer having a first refractive index formed on the coloring layer, a first transparent electrode having a higher second refractive index than the first refractive index formed on the transparent insulating layer, an organic layer having a light emitting layer formed on the first transparent electrode, and a second transparent electrode formed on the organic layer.

5 Claims, 19 Drawing Sheets

(56) References Cited

U.S. PATENT DOCUMENTS

2014/0306201 A1  10/2014  Yamazaki et al.

FOREIGN PATENT DOCUMENTS

| | | | |
|---|---|---|---|
| JP | 2004-271963 A | | 9/2004 |
| JP | 2005-222724 A | | 8/2005 |
| JP | 2007-234391 A | | 9/2007 |
| JP | 2007234391 A | * | 9/2007 |
| JP | 2008-047515 A | | 2/2008 |
| JP | 2014-220235 A | | 11/2014 |

OTHER PUBLICATIONS

Korean Office Action dated Mar. 26, 2018 for corresponding Korean Application No. 10-2017-0030584, with partial translation.

* cited by examiner

《 Equation 1  Conditions of reflection 》
 $\sin\theta > n_2/n_1$

《 Equation 2  SPH area 》
 $4\pi r^2$

《 Equation 3  AA corresponding area 》
 $2\pi(1-\cos\theta)r^2$

DISPLAY DEVICE

CROSS-REFERENCE TO RELATED APPLICATIONS

This application is based upon and claims the benefit of priority from the prior Japanese Patent Application No. 2016-057243, filed on Mar. 22, 2016, the entire contents of which are incorporated herein by reference.

FIELD

The present invention relates to a display device, and particularly to a display device using an organic EL (Electroluminescence) element.

BACKGROUND

In a display device using an organic EL element, a balance between a high luminous efficiency and a low outside light reflectivity needs to be achieved. While a circular polarizing plate may be provided on the emission side to reduce the outside light reflectivity to approximately zero in principle, its light extraction efficiency is reduced by less than half so that the high luminous efficiency is not obtained. This is because more than half of light emitted from the organic EL element is also absorbed by the circular polarizing plate.

Japanese Patent Application Laid-Open No. 2003-17264 (Patent Literature 1) discloses a display device including a plurality of light emitting sections by stacking a plurality of first electrodes in a line shape, an organic layer including a light emitting layer on the first electrodes, and a plurality of second electrodes in a line shape to intersect the first electrodes on the organic layer. A light absorption layer existing below the plurality of first electrodes in close contact therewith is arranged to prevent luminance from decreasing while suppressing outside light reflection.

Japanese Patent Application Laid-Open No. 2004-271963 (Patent Literature 2) discloses a display device including a light emitting element, a solar battery, in which an amorphous silicon substrate, a single crystalline silicon substrate, a roughened silicon substrate, and a light absorption layer such as a black insulating sheet are provided to contact the light emitting element to suppress outside light reflection.

Japanese Patent Application Laid-Open No. 2003-223993 (Patent Literature 3) discloses a display device in which an antireflection layer is provided below an organic EL element to prevent outside light reflection, and also discusses an example in which a circuit layer and an element substrate are arranged between the organic EL element and the antireflection layer.

Japanese Patent Application Laid-Open No. 2005-222724 (Patent Literature 4) discloses a display device including a light emitting element having an electrooptical layer between a pair of electrodes, in which one of the electrodes is formed on a surface of a light absorption layer and the light absorption layer is patterned to match a shape of the one electrode.

In the display devices disclosed in Patent Literatures 1 to 4, the outside light reflection caused by an electrode of the light emitting element can be significantly prevented because it is absorbed by the light absorption layer or the antireflection layer. However, half of light emitted within the organic EL element or a quantum dot light emitting element is absorbed by the light absorption layer or the antireflection layer, resulting in reduced luminous efficiency. Patent Literature 3 also discusses an example in which the circuit layer and the substrate are provided between the organic EL element and the antireflection layer. However, the circuit layer includes various types of wirings, a capacitive electrode, and a TFT (Thin Film Transistor). When the wirings, the capacitive element, and the TFT are illuminated with outside light, the outside light is reflected, leading a reduction in contrast. When the TFT is illuminated with outside light, this causes a malfunction in the TFT. If only the substrate is provided between the organic EL element and the antireflection layer, a region where the organic EL element is provided cannot be effectively utilized so that there is a problem in high refinement of the display device. Further, an interface between the substrate and a lower electrode of the organic EL element is rough. Display is feared to be adversely affected by reflection on the interface. This is because while the substrate is formed of glass, polyimide, or the like, roughness of its surface and a surface state by a foreign material or the like are not more strictly managed than those on layers above the circuit layer.

SUMMARY

A display device in an embodiment according to the present invention includes a first substrate, a coloring layer formed on the first substrate, a transparent insulating layer having a first refractive index formed on the coloring layer, a first transparent electrode having a higher second refractive index than the first refractive index formed on the transparent insulating layer, an organic layer having a light emitting layer formed on the first transparent electrode, and a second transparent electrode formed on the organic layer.

A display device in an embodiment according to the present invention includes a first substrate, a coloring layer formed on the first substrate, an antireflection layer formed on the coloring layer and having a stack of a plurality of first insulating layers having a first refractive index alternating with a plurality of second insulating layers having a higher second refractive index than the first refractive index, a first transparent electrode formed on the antireflection layer, an organic layer having a light emitting layer formed on the first transparent electrode, and a second transparent electrode formed on the organic layer.

A display device in an embodiment according to the present invention includes a first substrate, an optical layer formed on the first substrate, a first transparent electrode formed on the optical layer, an organic layer having a light emitting layer formed on the first transparent electrode, and a second transparent electrode formed on the organic layer. The optical layer absorbs outside light, and reflects light emitted from the light emitting layer and having a square angle of more than 50° from a normal to the first substrate.

DESCRIPTION OF EMBODIMENTS

One embodiment of the present invention will hereinafter be described below with reference to the drawings. However, the present invention includes many different aspects, and is not to be interpreted as being limited to contents of embodiments illustrated below. While the width, the thickness, the shape, and the like of each section may be more schematically indicated than those in actual aspects, this is only one example, and is not necessarily intended to limit a content of the one embodiment of the present invention.

First Embodiment

Figure 1:
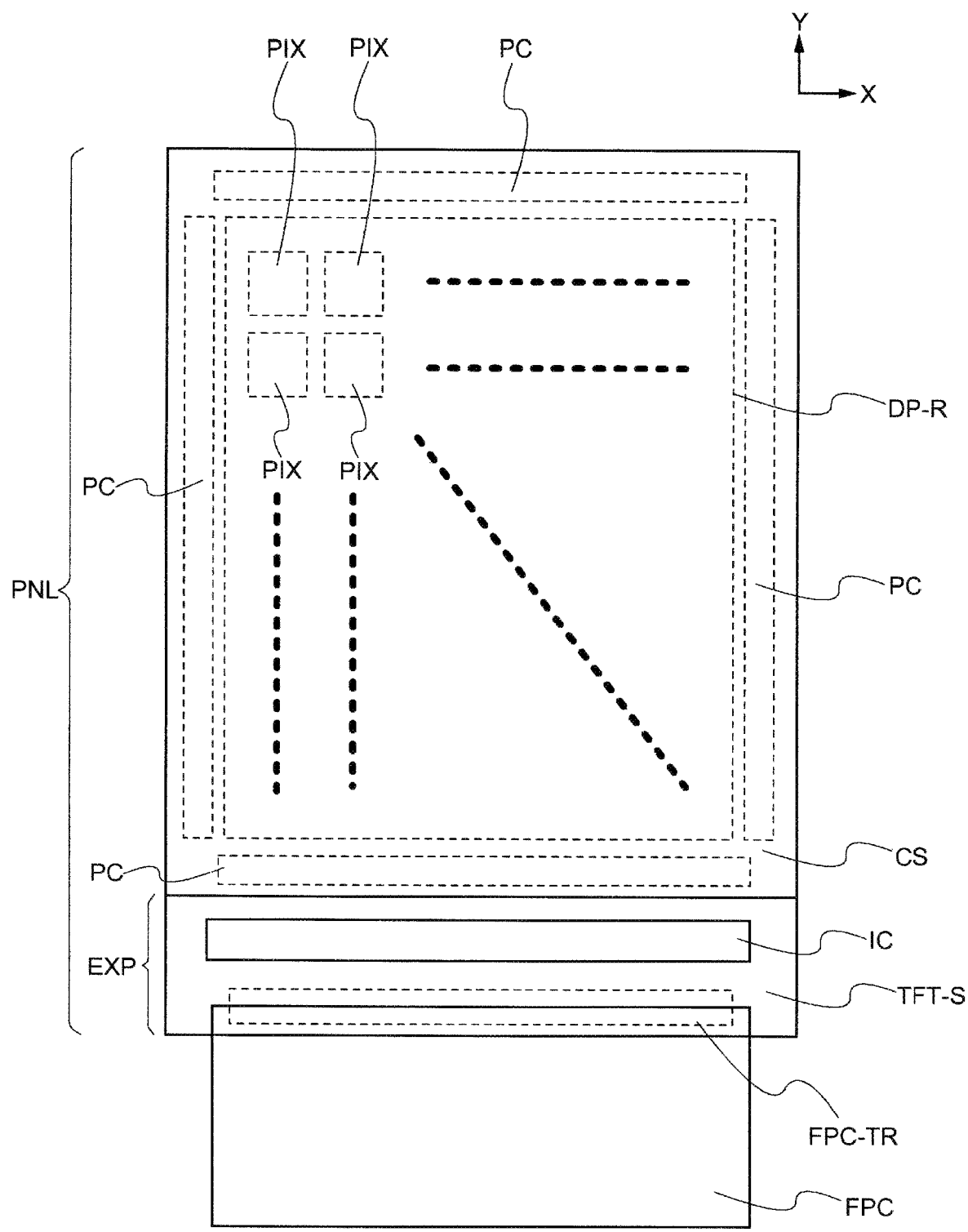
FIG. 1 is an overall plan view of a display device according to an embodiment of the present invention.
Figure 2:
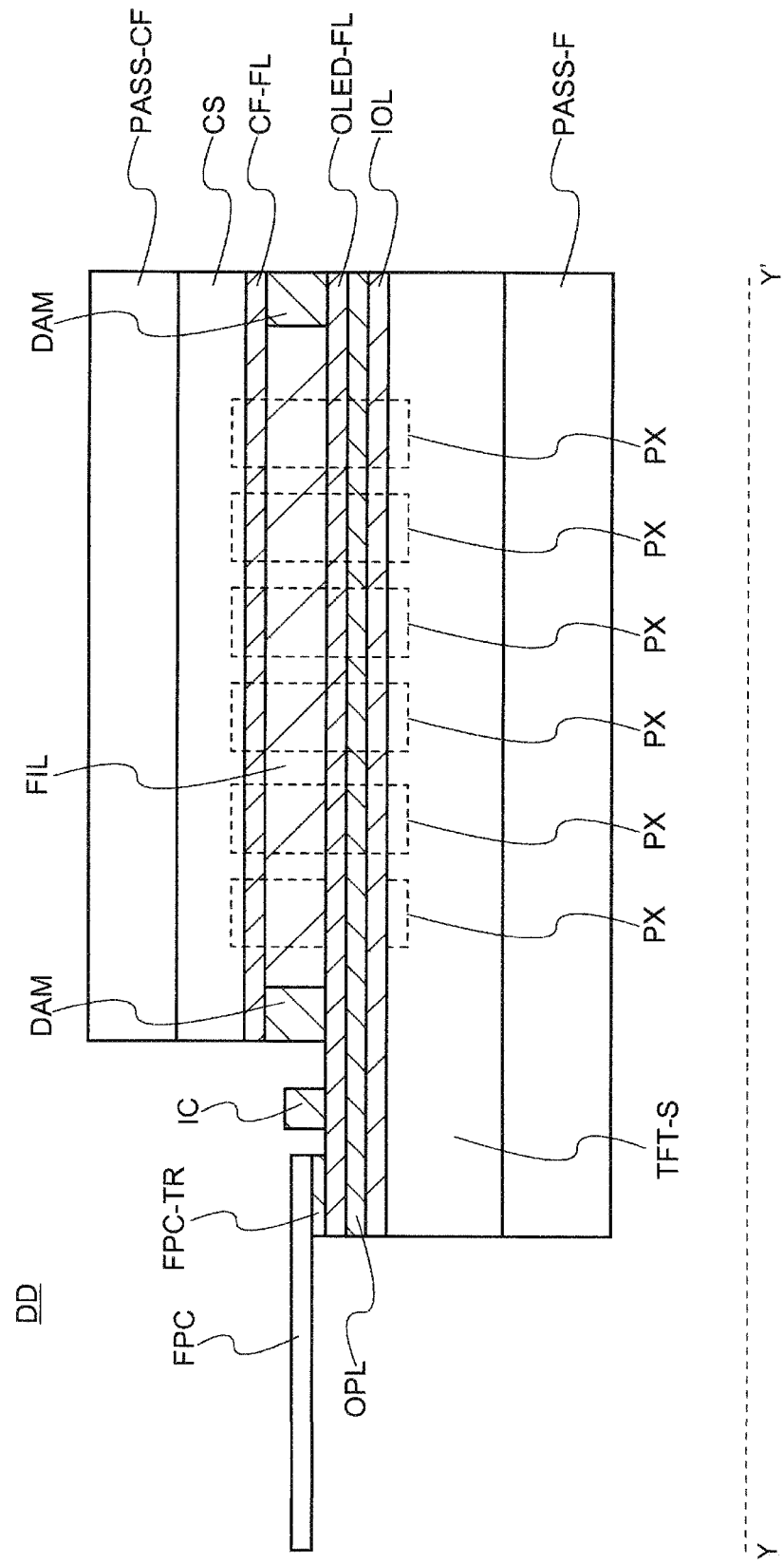
FIG. 2 is an overall sectional view of the display device according to the embodiment of the present invention.
Figure 3:
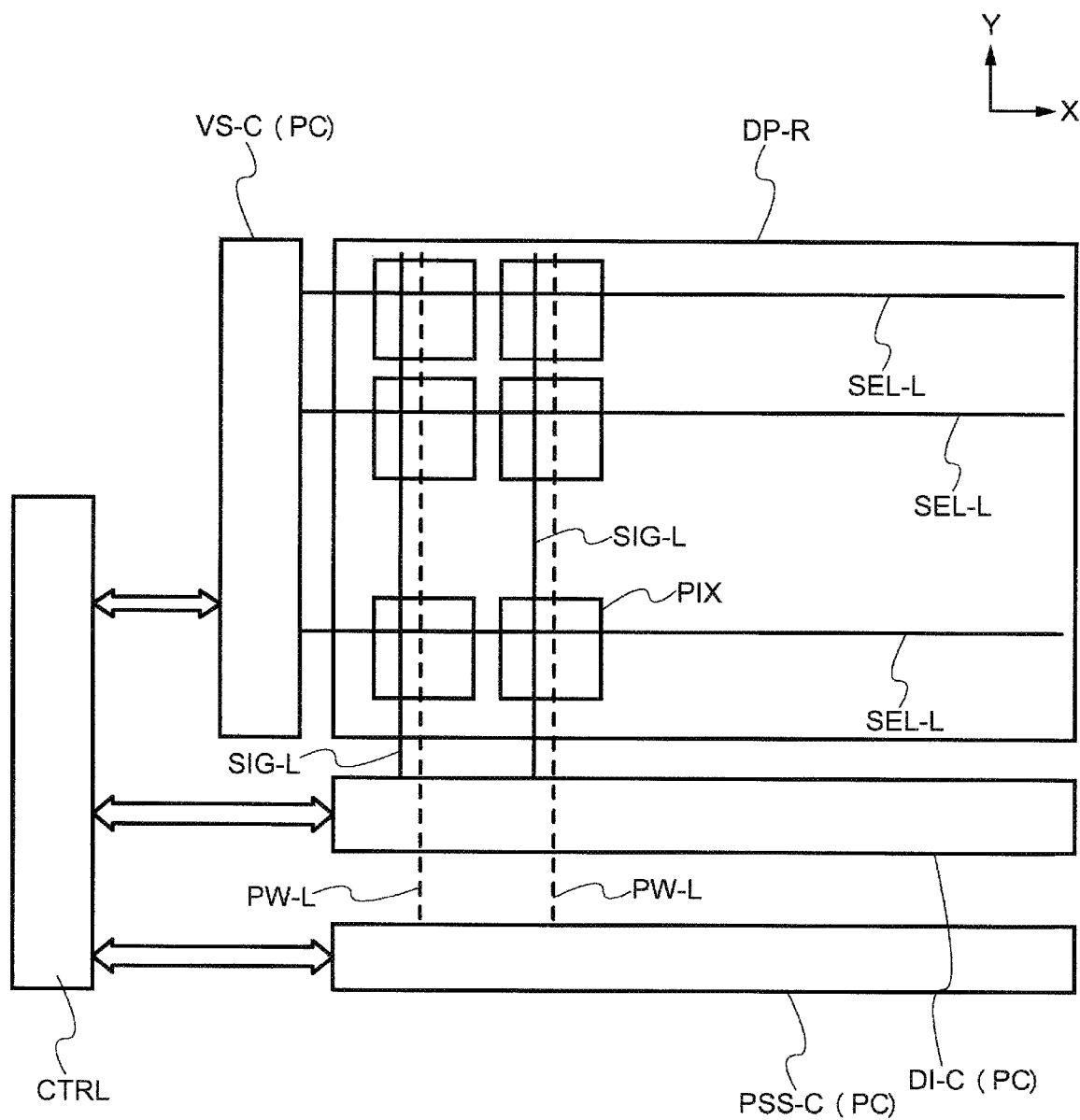
FIG. 3 is an overall circuit diagram of the display device according to the embodiment of the present invention.
Figure 4:
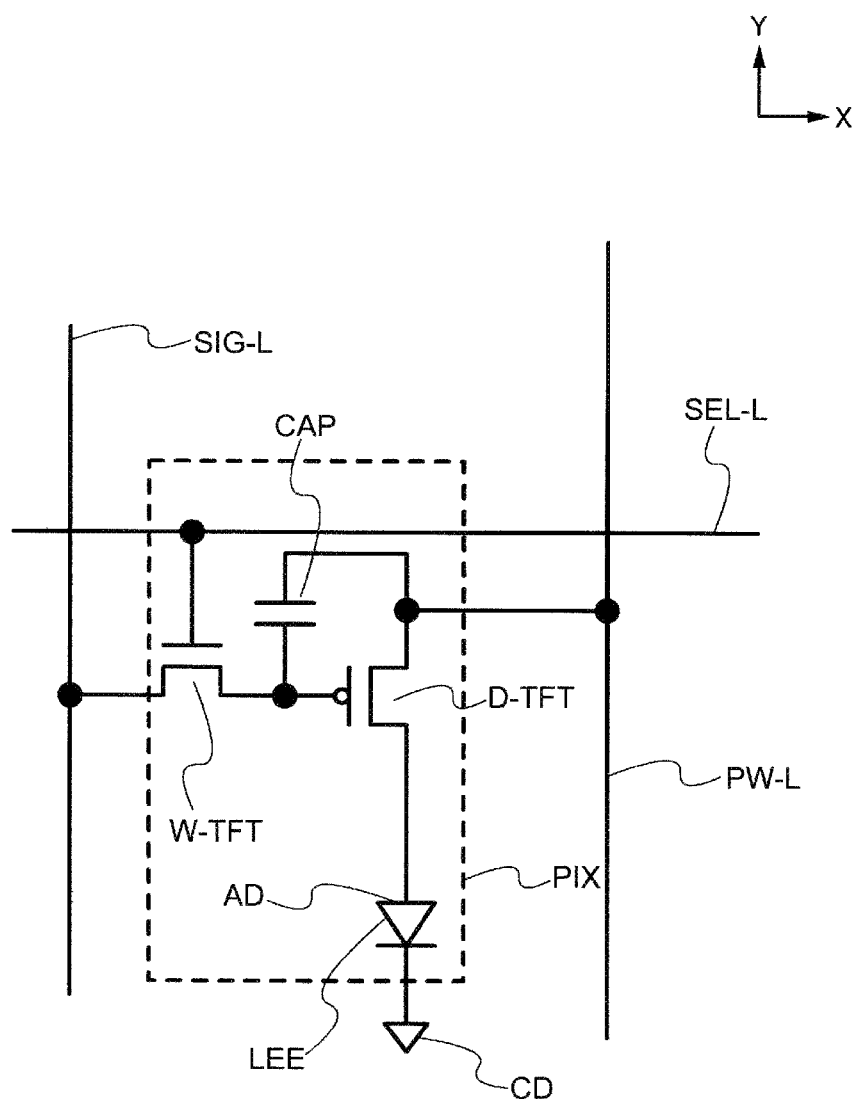
FIG. 4 is a circuit diagram of a pixel in the display device according to the embodiment of the present invention.
Figure 5:
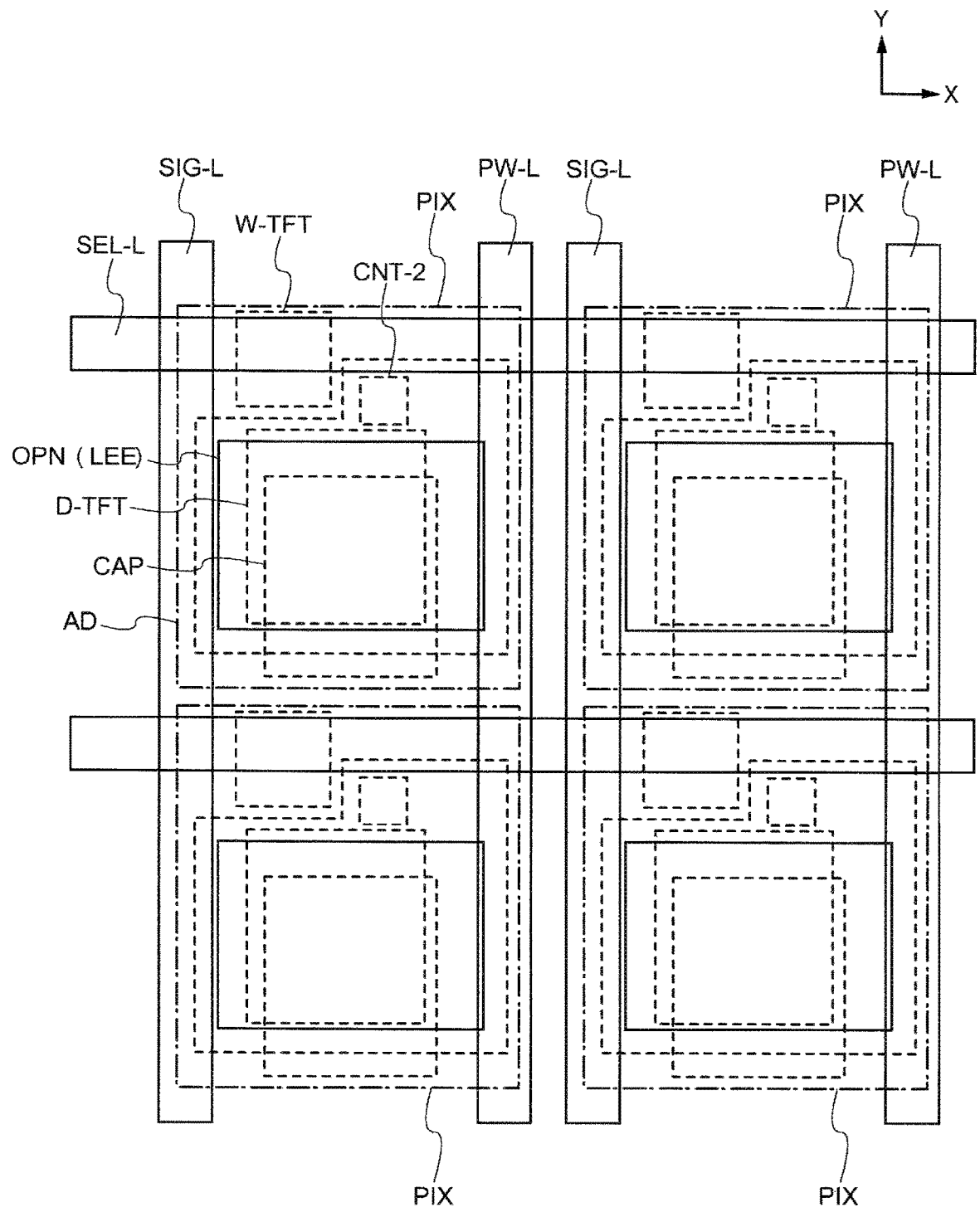
FIG. 5 is a plan view of a plurality of pixels in the display device according to the embodiment of the present invention.
Figure 6:
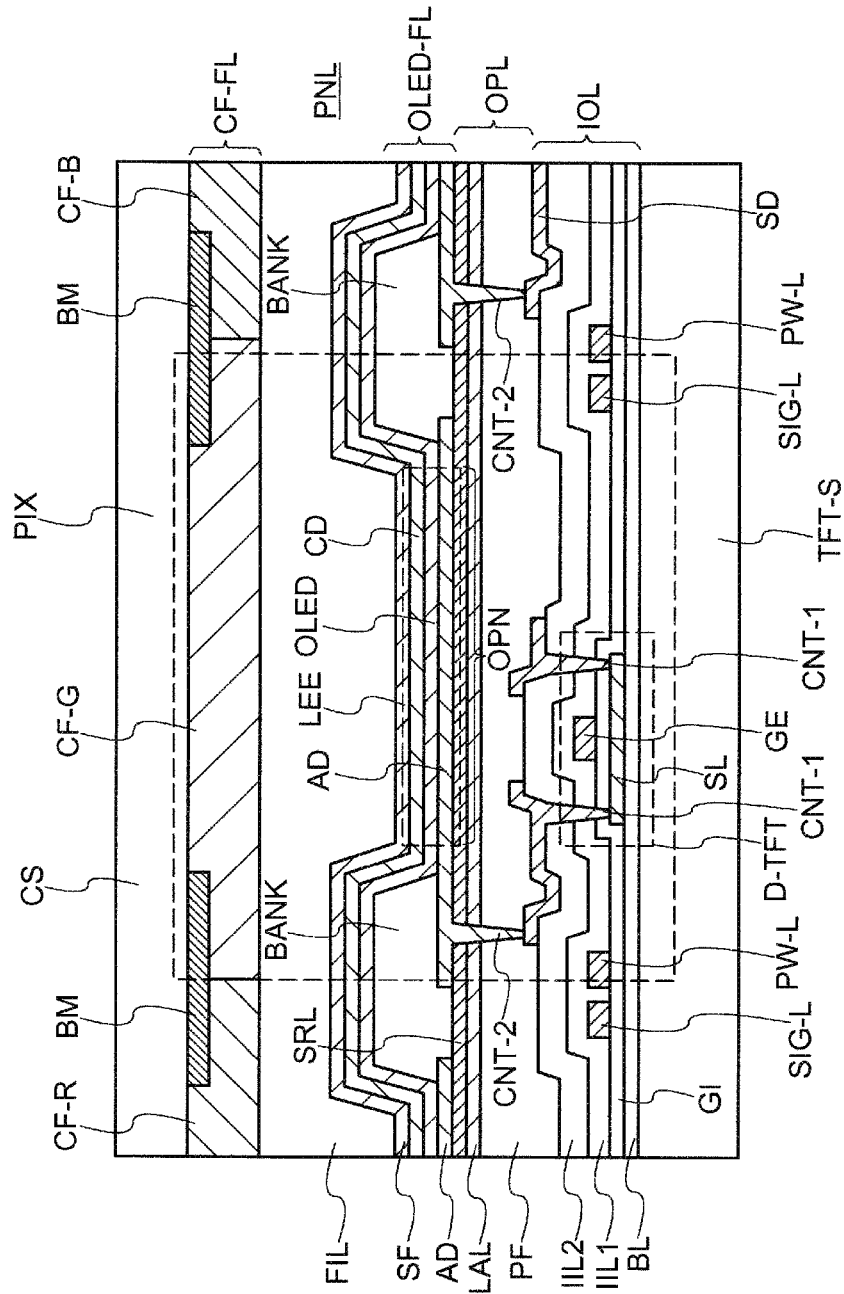
FIG. 6 is a cross-sectional view of the pixel in the display device according to the embodiment of the present invention.
Figure 7:
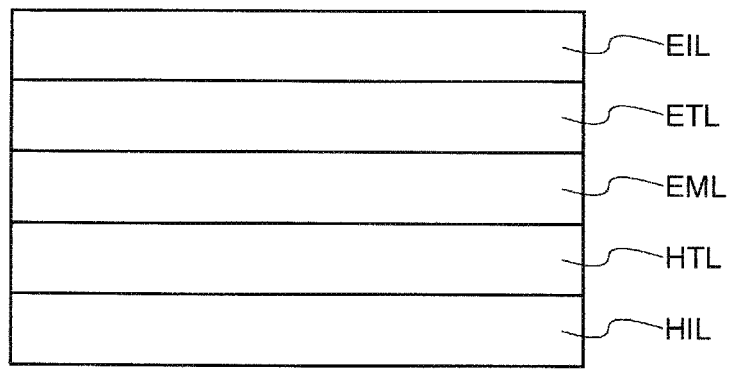
FIG. 7 is a cross-sectional view of an organic EL layer according to the embodiment of the present invention.
Figure 8:
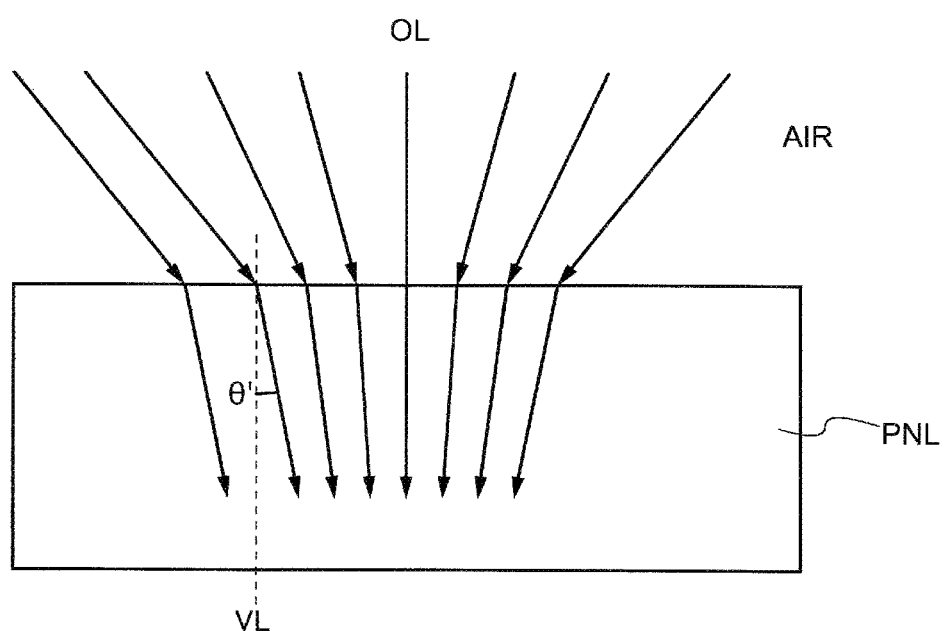
FIG. 8 illustrates a relationship between the inside and the outside of a display panel and outside light according to the embodiment of the present invention.
Figure 9:
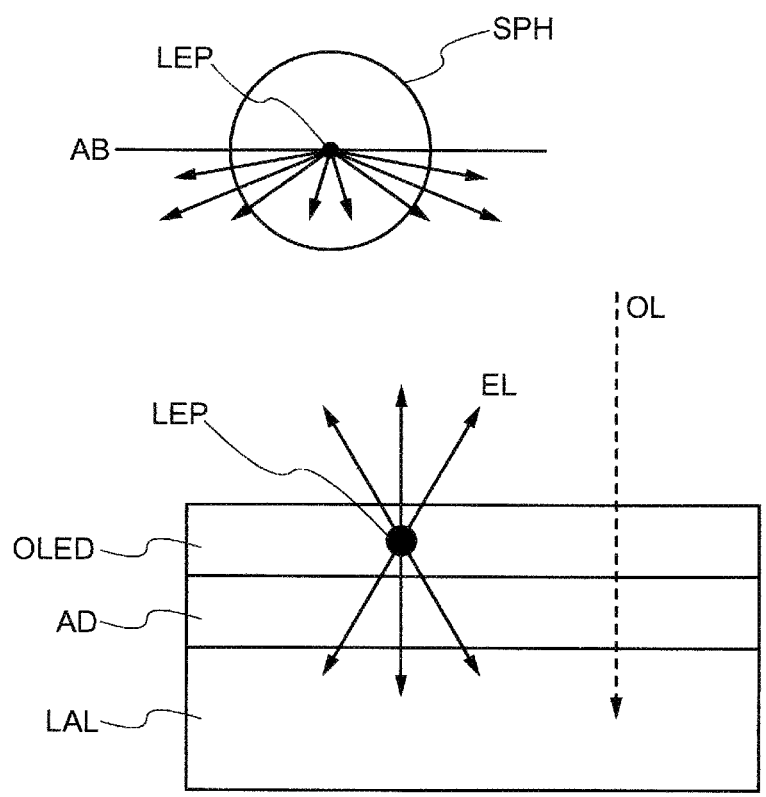
FIG. 9 illustrates a comparative example illustrating a trend of light emission from a light emitting point in the organic EL layer.
Figure 10:
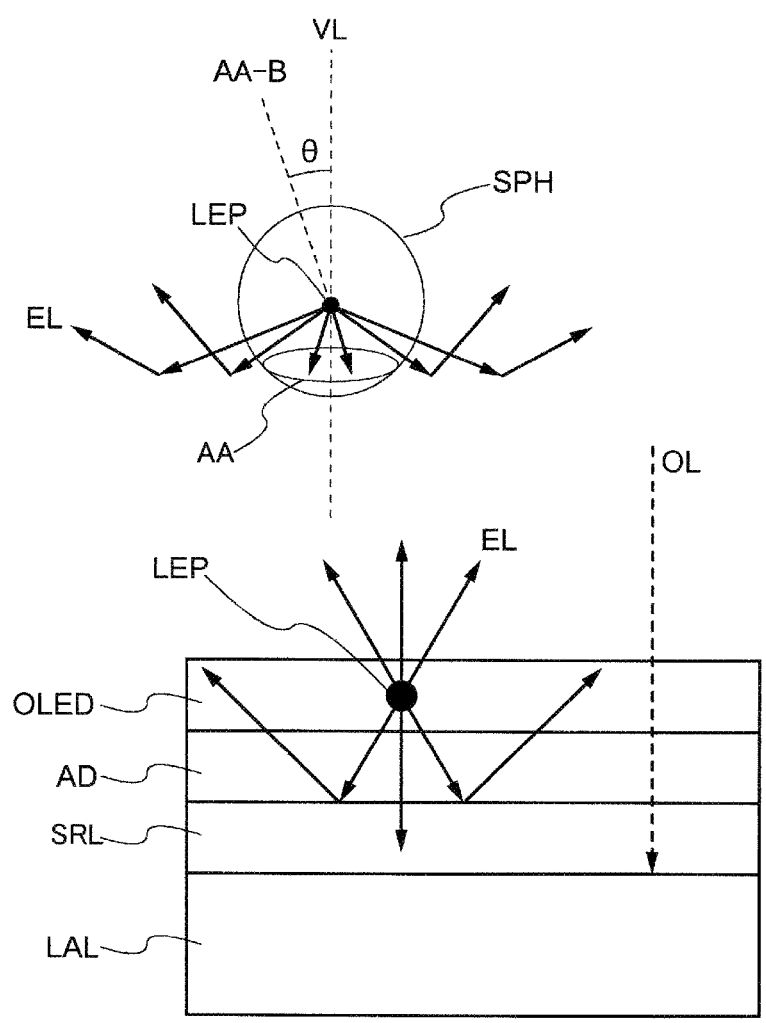
FIG. 10 illustrates a trend of light emission from the light emitting point in the organic EL layer according to the embodiment of the present invention.
Figure 11:
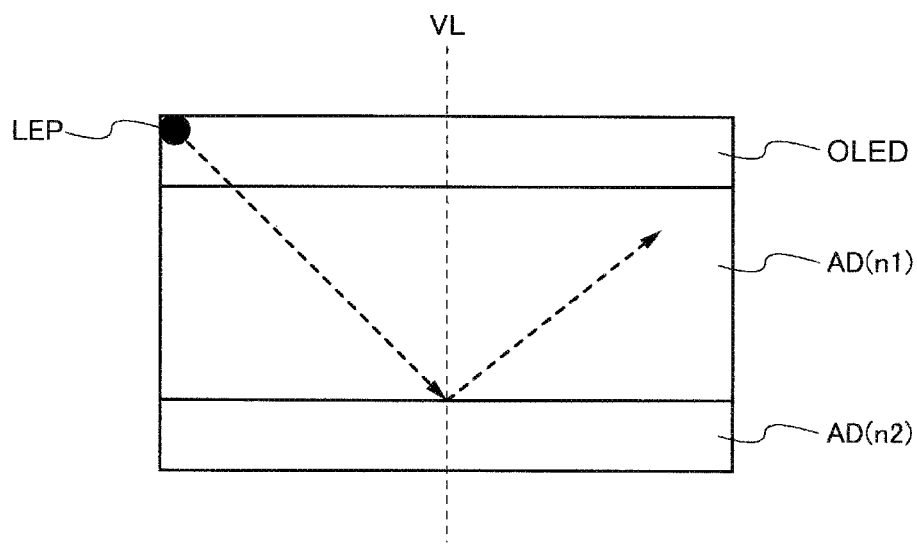
FIG. 11 illustrates a relationship of an angle of incidence of light emitted from the light emitting point in the organic EL layer according to the embodiment of the present invention.

A first embodiment will be described. FIG. 1 is an overall plan view of a display device DD. FIG. 2 is an overall sectional view corresponding to a cross section taken along a line Y-Y' of the display device DD. FIG. 3 is an overall circuit diagram of the display device DD. FIG. 4 is a circuit diagram of a pixel in the display device DD. FIG. 5 is a plan view of a plurality of pixels in the display device DD. FIG. 6 is a schematic sectional view of the pixel PIX in the display device DD. FIG. 7 is a cross-sectional view of an organic EL layer OLED. FIG. 8 illustrates a relationship between the inside and the outside of a display panel PNL and outside light. FIG. 9 illustrates a comparative example indicating a trend of light emitting EL from a light emitting point LEP in the organic EL layer OLED. FIG. 10 illustrates a trend of light emitting EL from the light emitting point LEP in the organic EL layer OLED. FIG. 11 illustrates a relationship of an angle of incidence of light emitting EL from the light emitting point LEP in the organic EL layer OLED.

The display device DD illustrated in FIG. 1 includes a display panel PNL, a semiconductor device IC, and a flexible printed circuit board FPC. The display panel PNL includes a TFT substrate TFT-S and a counter substrate CS provided so that its main surface opposes a main surface of the TFT substrate TFT-S. There is a region where the TFT substrate TFT-S is exposed from the counter substrate CS in a planar view. The region is defined as an exposure region EXP.

In the exposure region EXP, the semiconductor device IC is arranged to be connected to the TFT substrate TFT-S via a connection terminal (not illustrated), and the flexible printed circuit board FPC is connected to the TFT substrate TFT-S via a flexible printed circuit board terminal FPC-TR at an end of the exposure region EXP. The flexible printed circuit board FPC is supplied with a video signal and a control signal from the outside, and supplies a video signal and a control signal supplied to the display panel PNL and the semiconductor device IC. The semiconductor device IC performs display control of the display panel PNL based on the video signal and the control signal from the flexible printed circuit board FPC. The semiconductor device IC may be mounted on the flexible printed circuit board FPC.

A display region DP-R exists in a central portion corresponding to a large part of a region where the counter substrate CS is arranged in the display panel PNL. In the display region DP-R, pixels PIX are arranged in a matrix shape (in a matrix shape in an X-direction and a Y-direction). A display image is displayed on the display region DP-R when each of the pixels PIX is controlled based on a display signal and a control signal. The two by two pixels PIX in the X- and Y-directions constitute one set, to respectively display red, blue, green, and white. This set of pixels serves as display pixels to perform pixel display. The display images are also arranged in a matrix shape. The one set of pixels need not necessarily include the two by two pixels in the X- and Y-directions. Particularly in a system not using a color filter, the three pixels PIX in the X-direction may constitute one set of pixels, to respectively display red, blue, and green. This set of pixels may serve as display pixels to perform image display. The three pixels in the Y-direction may constitute one set of pixels, to respectively display red, blue, and green. This set of pixels may serve as display pixels to perform image display.

Peripheral circuits PC are respectively arranged in peripheries of the display region DP-R corresponding to a large part of the region where the counter substrate CS is arranged in the display panel PNL. This peripheral circuit PC is controlled by the semiconductor device IC.

The display panel PNL in the display device DD illustrated in FIG. 2 includes a passivation film PASS-F formed of resin such as PET (polyethylene terephthalate) or polycarbonate, a TFT substrate TFT-S formed of glass or polyimide, which is thinner than the passivation film PASS-F, on the passivation film PASS-F, an inorganic layer IOL formed of a plurality of inorganic films on the TFT substrate TFT-S, an optical layer OPL performing an optical function on the inorganic layer IOL, an organic EL formation layer OLED-FL having a plurality of organic EL elements formed on the optical layer OPL, a filling layer FIL formed of translucent resin to be arranged in the display region DP-R on the organic EL formation layer OLED-FL, a seal DAM provided to surround the filling layer FIL on the organic EL formation layer OLED-FL and formed when resin or powdered glass cured by heat or ultraviolet rays is melted, a color filter layer CF-FL having a color filter formed on the filling layer FIL, a counter substrate CS formed of translucent glass or translucent polyimide on the color filter layer F-FL, a passivation film PASS-CF formed of translucent resin such as PET or polycarbonate or translucent and high-strength glass on the counter substrate CS and being thicker than the counter substrate CS, and a flexible printed circuit board terminal FPC-TR. A plurality of pixels PIX are arranged within the display region DP-R in the display panel PNL. A touch panel may be formed in the passivation film PASS-CF, the counter substrate CS, or a region extending over the passivation film PASS-CF and the counter substrate CS. In each embodiment, a direction toward the counter substrate CS from the TFT substrate TFT-S is an upward direction, and a direction toward the TFT substrate TFT-S from the counter substrate CS is a downward direction.

The display device DD further includes the semiconductor device IC and the flexible printed circuit board FPC to be connected to the flexible printed circuit board terminal FPC-TR.

An entire circuit of the display device DD illustrated in FIG. 3 includes a controller CTRL which controls driving and display of the display device DD based on the video signal and the control signal from the flexible printed circuit board FPC. The controller CTRL controls each of the peripheral circuits PC to exchange various types of signals with one another. The controller CTRL is formed within the semiconductor device IC. The controller CTRL converts the video signal from the flexible printed circuit board FPC into a display signal. The peripheral circuit PC includes a power supply control circuit PSS-C, a display signal control circuit DI-C, and a selection signal control circuit VS-C.

The power supply control circuit PSS-C, to which a plurality of power lines PW-L are connected, supplies various types of power supply voltages to the power lines PW-L according to control from the controller CTRL. The display signal control circuit DI-C, to which a plurality of signal lines SIG-L are connected, supplies various types of display signals to the signal lines SIG-L based on the display signal and control from the controller CTRL. The selection signal control circuit VS-C, to which a plurality of selection lines SEL-L are connected, supplies a selection signal to the selection lines SEL-L based on control from the controller CTRL.

The plurality of power lines PW-L are arranged in the X-direction in parallel with one another, and have a form to extend in the Y-direction. The plurality of signal lines SIG-L are arranged in the X-direction in parallel with one another, and have a form to extend in the Y-direction. The plurality of selection lines SEL-L are arranged in the Y-direction in parallel with one another, and have a form to extend in the X-direction. When the pixels PIX are respectively provided in intersections of the power lines PW-L and the selection lines SEL-L (intersections of the signal lines SIG-L and the selection lines SEL-L), the pixels PIX are arranged in a matrix shape.

The pixel PIX illustrated in FIG. 4 includes a writing transistor W-TFT formed of an NMOS (Negative Channel Metal Oxide Semiconductor), a driving transistor D-TFT formed of a PMOS (Positive Channel Metal Oxide Semiconductor), a capacitive element CAP, and a light emitting element LEE, and these constituent elements form a pixel circuit.

The writing transistor W-TFT has its one source/drain terminal connected to the signal line SIG-L, has its other source/drain terminal connected to a gate terminal of the driving transistor D-TFT, and has its gate terminal connected to the selection line SEL-L. The capacitive element CAP has its one electrode connected to the gate terminal of the driving transistor D-TFT and has its other electrode connected to a source terminal of the driving transistor D-TFT. The source terminal of the driving transistor D-TFT is connected to the power line PW-L, and the drain terminal is connected to the anode AD of the light emitting element LEE. The cathode CD of the light emitting element LEE is provided to be common among the pixels PIX.

FIG. 5 illustrates a planar layout of the two by the two pixels PIX. In each of the pixels PIX indicated by a one-dot and dash line, a writing transistor W-TFT indicated by a dotted line, a driving transistor D-TFT indicated by a dotted line, a capacitive element CAP indicated by a dotted line, a light emitting element LEE indicated by a solid line, an anode AD indicated by a dotted line, and a contact CNT2 indicated by a dotted line are illustrated. An insulating bank is arranged outside the light emitting element LEE, and serves as a non-luminescent region. A region of the light emitting element LEE is an opening region OPN where the insulating bank BANK is not arranged. The opening region OPN where the insulating bank BANK is not arranged is arranged inside a region where the anode AD is arranged. The contact CNT2 is used to link the anode AD to an underlying electrode. The contact CNT2 overlaps the anode AD in a planar view, and overlaps the insulating bank BANK in a planar view. All peripheral ends of the anode AD are covered with the insulating bank BANK. A part of the writing transistor W-TFT overlaps the selection line SEL-L, hardly overlaps the anode AD, and does not overlap the opening region OPN. A large part of the driving transistor D-TFT overlaps the opening region OPN, a large part of the driving transistor D-TFT overlaps the capacitive element CAP, and the driving transistor D-TFT overlaps the anode AD. A large part of the capacitive element CAP overlaps the opening region OPN, a large part of the capacitive element CAP overlaps the driving transistor D-TFT, and the capacitive element CAP overlaps the anode AD. Each of respective parts of the ends of the anode AD overlaps the signal line SIG-L, the power line PW-L, or the selection line SEL-L.

FIG. 6 is a schematic sectional view of the pixel PIX, and also illustrates a cross section in its periphery. The passivation film PASS-F and the passivation film PASS-CF are omitted. The inorganic layer IOL on the TFT substrate TFT-S includes a base layer BL including a stack of a silicon nitride film and a silicon oxide film, a semiconductor layer SL formed of any one of polycrystalline silicon (polysilicon), amorphous silicon, and an oxide semiconductor arranged on the base layer BL, a gate insulating film GI arranged on the base layer BL and the semiconductor layer SL, a gate electrode GE arranged on the semiconductor layer SL via the gate insulating film GI, a signal line SIG-L and a power line PW-L arranged on the gate insulating film GI, an inorganic interlayer insulating film layer IIL1 arranged on the gate insulating film GI, the gate electrode GE, the signal line SIG-L, and the power line PW-L, an inorganic interlayer insulating film layer IIL2 arranged on the inorganic interlayer insulating film IIL1, a wiring SD arranged on the inorganic interlayer insulating film IIL2, and contacts CNT1 respectively arranged within openings provided in the gate insulating film GI, the inorganic interlayer insulating film IIL1, and the inorganic interlayer insulating film IIL2 on the semiconductor layer SL and formed of a material for the wiring SD. The semiconductor layer SL on the bottoms of the contacts CNT1 serves as a source and a drain of the driving transistor D-TFT. The inorganic layer IOL is basically all formed of an inorganic material. Any one of the gate insulating film GI, the inorganic interlayer insulating film IIL1, and the inorganic interlayer insulating film IIL2 is formed of an insulating film such as a silicon nitride film, a silicon oxide film, a silicon carbide film, a silicon carbonitride, an aluminum oxide film, and an aluminum nitride film. The gate electrode GE and the signal line SIG-L and the power line PW-L are formed of the same material. Each of the signal line SIG-L, the power line PW-L, the gate electrode GE, and the wiring SD is composed of any one of aluminum, molybdenum, titanium, and tungsten or their stack.

An optical layer OPL is arranged on the inorganic layer IOL. The optical layer OPL includes a planarizing film PF, a light absorption layer LAL on the planarizing film PF, and a selective reflection layer SRL on the light absorption layer LAL. The planarizing film PF is an organic layer formed of resin such as acrylic or epoxy, and reduces a step of the inorganic layer IOL. The light absorption layer LAL is a layer colored by mixing a coloring pigment with resin such as acrylic or epoxy, and black is mainly used as the coloring pigment. The coloring pigment may be a material having low visibility such as blue. Further, the light absorption layer LAL may be formed by mixing a coloring dye such as black with resin, or may be formed by mixing a coloring material such as carbon block or titanium black with resin. In addition, chromium may be used as the light absorption layer LAL. However, in the case, an insulating layer needs to be sandwiched between the light absorption layer LAL and an electrode coming in contact therewith, for example, to ensure an insulating property therebetween. The thickness of the light absorption layer LAL is set to 0.1 to 1.0 μm. If the thickness is smaller than 0.1 μm, light cannot be sufficiently absorbed. If the thickness is larger than 1 μm, a formation period of time becomes long. The selective reflection layer SRL is a transparent insulating layer formed to be able to up and down direction transmit light and formed of resin such as acrylic or epoxy or a silicon oxide film, and its refractive index is approximately 1.5 and within a range of 1.3 and 1.6. The thickness of the selective reflection layer SRL is set to 100 nm to 1.0 μm. When the thickness is smaller than 100 nm, light cannot be sufficiently reflected by seeping. When the thickness is larger than 1 μm, a formation period of time becomes long.

An organic EL element formation layer OLED-FL is provided on the optical layer OPL. The organic EL element formation layer OLED-FL includes an anode AD, an insulating bank BANK covering a peripheral portion of the anode AD, an organic EL layer OLED covering the anode AD and the insulating bank BANK, a cathode CD covering the organic EL layer, a sealing film SF covering the cathode CD, and a contact CNT2 connecting a wiring SD and the anode AD. The anode AD is formed to be able to up and down direction transmit light and formed of a transparent conductive film of a metal oxide such as ITO (Indium Tin Oxide) or IZO (Indium Zinc Oxide). Various types of metal layers each formed of a metal such as Al, Ag, MgAl, Ti, or W having a thickness set not to transmit light are not used. The thickness of the anode AD is set to 10 nm to 1 μm. When the thickness is smaller than 10 nm, a resistance value increases so that a problem occurs in luminescent display. When the thickness is larger than 1 μm, a formation period of time becomes long.

Light generated on the organic EL layer OLED passes through the anode AD, and its part is extracted outward after being reflected on an interface between the anode AD and the selective reflection layer SRL and its part is absorbed by the light absorption layer LAL after passing through the anode AD and the selective reflection layer SRL, although described in detail below. The refractive index of the anode AD is approximately 2.0 and within a range of 1.7 and 2.5, and is higher than the refractive index of the selective reflection layer SRL. The insulating bank BANK is an insulating film formed of resin such as acrylic or epoxy. The organic EL layer OLED is an organic layer including a light emitting layer EML, and its detailed structure will be described below. The thickness of the organic EL layer OLED is 0.1 to 0.5 μm, and varies depending on its layered structure. The cathode CD is formed to be able to up and down direction transmit light, and is formed of a thin film metal such as Ag or MgAg or a transparent metal oxide conductive layer such as ITO or IZO. If the cathode CD is formed of Ag or MgAg, the thickness thereof is not more than approximately 20 nm. The cathode CD is sufficiently thin to transmit light. The anode AD, the organic EL layer OLED, and the cathode CD respectively have almost the same refractive indexes between 1.7 to 2.5.

A filling layer FIL is formed on the organic EL formation layer OLED-FL. The filling layer FIL is formed of a highly translucent material, and is formed of resin or the like. A color filter layer CF-FL is formed on the filling layer FIL. The color filter layer CF-FL includes a red color filter CF-R, a green color filter CF-G, a blue color filter CF-B, and black matrices BM respectively provided among the color filters. The red color filter CF-R is formed of a mixture of a red pigment with resin. Similarly, the green color filter CF-G is formed of a mixture of a green pigment with resin. The blue color filter CF-B is formed of a mixture of a blue pigment with resin. The black matrix BM is a layer colored by mixing a black pigment with resin such as acrylic or epoxy or formed of a black metal material such as chromium. A counter substrate CS is formed on the color filter layer CF-FL. All numerical values of the thickness, the size, and the like in the present embodiment may be respectively used as references each representing a small and large relationship among sections, although they are all one examples.

Various types of transistors such as the driving transistor D-TFT indicated by a dotted line is formed within the inorganic layer IOL. The driving transistor D-TFT includes the semiconductor layer SL, the gate electrode GE, and the gate insulating film GI existing in a region sandwiched between the semiconductor layer SL and the gate electrode GE. The semiconductor layer SL just below the gate electrode GE serves as a channel of the driving transistor D-TFT, and the semiconductor layer SL just below the two contacts CNT1 serves as a source and a drain of the driving transistor D-TFT. A light emitting element LEE indicated by a dotted line is formed within the organic EL formation layer OLED-FL. As illustrated in FIG. 5, the light emitting element LEE is formed in a region where the insulating bank BANK is not formed in a planar view, and is formed by the anode AD, the organic EL layer OLED contacting the anode AD, and the cathode CD contacting the organic EL layer OLED. The organic EL layer OLED in the light emitting element LEE emits light. The pixel PIX is in a range illustrated in FIG. 6, and has one type of color filter. A boundary between the pixels PIX includes a boundary between color filters, and the black matrix BM is arranged in this boundary.

The organic EL layer OLED illustrated in FIG. 7 includes a hole injection layer HIL on the anode AD, a hole transport layer HTL on the hole injection layer HIL, a light emitting layer EML on the hole transport layer HTL, an electron transport layer ETL on the light emitting layer EML, and an electron injection layer EIL on the electron transport layer ETL. The layers are formed of a known organic material. The light emitting layer EML is formed of an organic luminescent material. Thus, an organic EL element is formed. However, the light emitting layer EML may be replaced with a quantum dot, or a quantum dot may be added to the organic luminescent material forming the light emitting layer EML. In the case, the light emitting element LEE has a property of a QLED (Quantum Dot Light Emitting Diode) or both properties of a QLED and an OLED (Organic Light Emitting Diode).

As illustrated in FIG. 8, when outside light OL enters the display panel PNL via air AIR, its angle of incidence θ becomes smaller in the display panel PNL than that in the air AIR from a difference in refractive index therebetween. All angles, described below, are respectively solid angles. The angle of incidence θ' is an angle formed between the outside light OL and a vertical line VL serving as a straight line perpendicular to a display surface of the display device DD. While the refractive index of the air AIR is approximately 1, the refractive index of the display panel PNL is higher than 1 and approximately 2. This indicates that almost all of the outside light OL is reflected after entering the display panel PNL at a small angle of incidence.

As illustrated in FIG. 9, the light emitting point LEP in the organic EL layer OLED in the light emitting element LEE produces light emitting ELs anisotropically in a spherical surface SHP manner. The organic EL layer OLED in the light emitting element LEE can also be regarded as a set of light emitting points LEP at the time of light emission. When the selective reflection layer SRL does not exist, and the light absorption layer LAL exists below the anode AD, as illustrated in FIG. 9, all the light emitting ELs from the light emitting point LEP on the side below an absorption boundary AB corresponding to the side below half of the spherical surface SPH are absorbed. Therefore, half of the light emitting ELs cannot be used. The outside light OL is absorbed by the light absorption layer LAL. In a boundary between the organic EL layer OLED and the anode AD, the light emitting ELs are not basically reflected. This is because the refractive index of the anode AD is generally higher than the refractive index of the organic EL layer OLED so that the light emitting ELs enter the anode AD.

As illustrated in FIG. 10, a selective reflection layer SRL exists between an anode AD and a light absorption layer LAL, unlike in FIG. 9. In this case, only light emitting ELs corresponding to an absorption region AA of a spherical surface SHP, among light emitting ELs from a light emitting point LEP are absorbed, and the other light emitting ELs can be extracted outward by reflection or the like. Some of the light emitting ELs are reflected on an interface between the anode AD and the selective reflection layer SRL, and are extracted outward. An angle formed between a vertical line VL and an absorption region boundary AA-B is θ, and the light emitting EL from the absorption region AA corresponding to a range of this angle is absorbed by the light absorption layer LAL.

When the refractive index of the anode AD is n1 and the refractive index of the selective reflection layer SRL is n2, as illustrated in FIG. 11, an angle θ satisfying a reflection condition has a relationship as expressed by (equation 1):

$$\sin \theta > n2/n1 \quad (1)$$

The area of the spherical surface SPH has a relationship as expressed by (Equation 2), and the area of a spherical portion of the spherical surface SPH corresponding to the absorption region AA has a relationship as expressed by (Equation 3). This indicates that the percentage of the light emitting ELs absorbed by the light absorption layer LAL is small if the angle θ is approximately 50°, and indicates that a display device DD capable of extracting the light emitting EL with significantly high efficiency if the respective refractive indices of the anode AD and the selective reflection layer SRL are determined so that the angle θ is not more than 50°. Outside light OL illustrated in FIG. 10 is incident on the selective reflection layer SRL at an angle of θ'. This angle θ' substantially becomes smaller than the angle θ so that the outside light OL is absorbed by the light absorption layer LAL. Almost all of such a relationship of the angle θ can be satisfied if a material for the selective reflection layer SRL and a material for the anode AD, as described in FIG. 6, are selected.

$$4\pi r^2 \quad (2)$$

$$2\pi(1-\cos \theta)r^2 \quad (3)$$

If the selective reflection layer SRL is provided below the anode AD, and the light absorption layer LAL is provided below the selective reflection layer SRL, like in the present embodiment, a significant percentage of the light emitting ELs from the light emitting element LEE can be extracted outward. Further, the outside light EL can be sufficiently prevented from being reflected even if a circular polarizing plate is not provided on the side of the counter substrate CS in order for the light absorption layer LAL to absorb almost all of the outside light OL. Therefore, the circular polarizing plate is not required, and more than half of the light emitting ELs from the light emitting element LEE are not cut by the circular polarizing plate. Further, the light absorption layer LAL exists. Therefore, even if various types of elements (a TFT, a capacitance, and various types of wirings) are arranged below the light absorption layer LAL, the outside light OL is prevented from being reflected by the various types of elements. Particularly, the TFT is prevented from malfunctioning upon receipt of the outside light OL.

Second Embodiment

Figure 12:
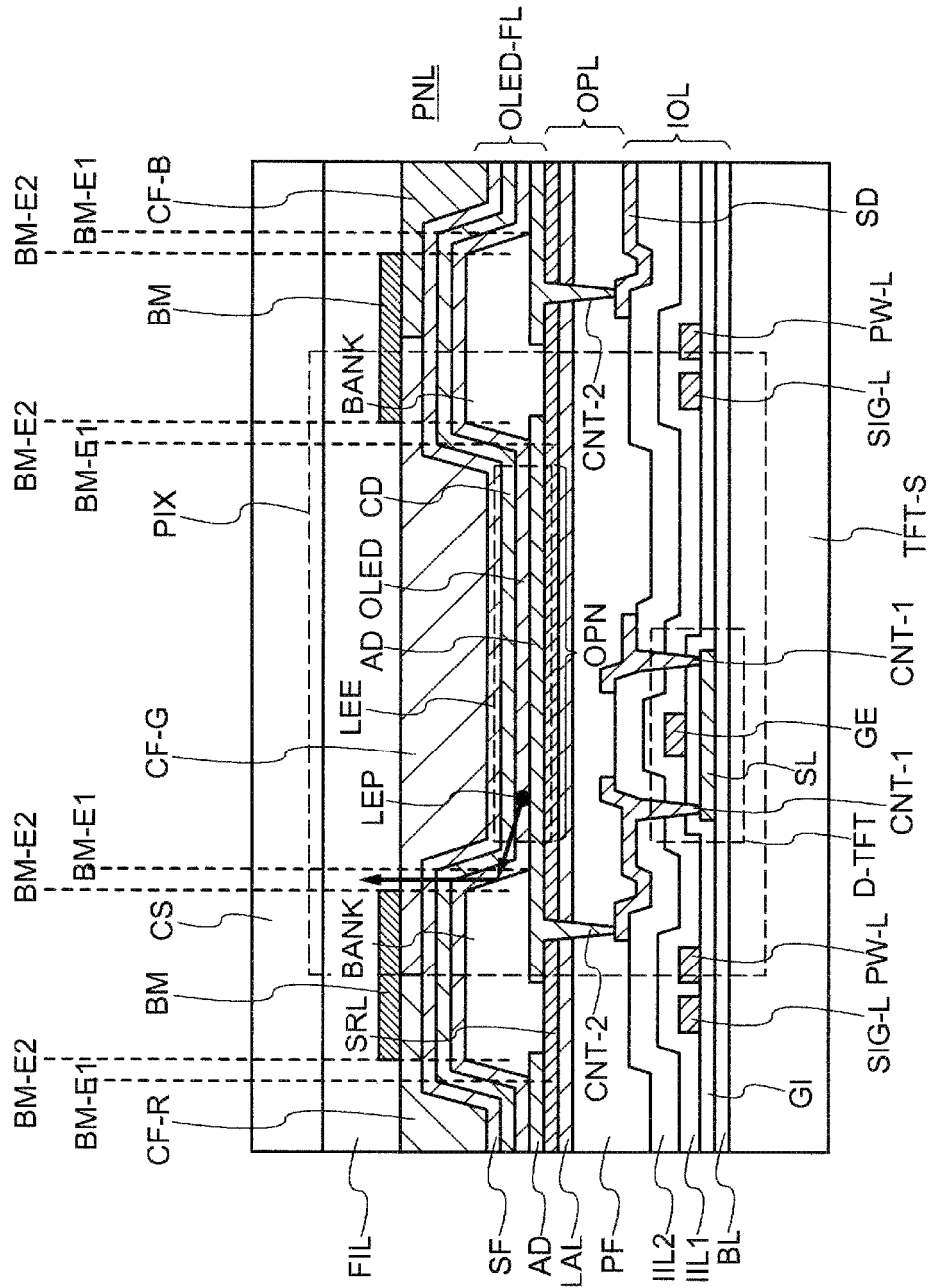
FIG. 12 is a cross-sectional view of a pixel in a display device according to an embodiment of the present invention.

In the following embodiment, a site different from that in the aforementioned embodiment will be described. The same constituent elements are assigned the same reference numerals as those in the aforementioned embodiment. FIG. 12 is a schematic sectional view of a pixel PIX in a display device. The color filter layer CF-FL is not provided but a color filter is provided for each pixel PIX between a sealing film SF and a filling layer FIL. A red color filter CF-R1, a green color filter CF-G1, and a blue color filter CF-B1 are respectively provided at the pixel PIX for red display, the pixel PIX for green display, and the pixel PIX for blue display. A black matrix BM1 is arranged between each of boundaries among the color filters and the filling layer FIL. When the color filter and the black matrix BM1 are thus respectively provided in places close to a light emitting element LEE, an optical color mixture (a phenomenon that light from an adjacent light emitting layer EML passes through the color filter so that light in an undesirable color is extracted, e.g., a phenomenon that light from a light emitting layer just below the red color filter CF-R1 passes through the adjacent green color filter CF-G1 so that light in an undesirable color is extracted) can be reliably prevented.

An end of the black matrix BM1 may be made to match an end of an insulating bank BANK, like an end BM-E1, or may be made to match a boundary between a flat portion (apex) of the insulating bank BANK and an inclined plane, like an end BM-E2. When the end of the black matrix BM1 is made to match the end BM-E1, an optical color mixture can be more reliably prevented. When the end of the black matrix BM1 is made to match the end BM-E2, light emitting EL from a light emitting point LEP is reflected on the inclined plane of the insulating bank BANK and is easily extracted outward due to a difference in material caused by a difference between a formation material for the insulating bank BANK and a formation material for the an organic EL layer OLED. This is because the refractive index of the insulating bank BANK is lower than the refractive index of the organic EL layer OLED so that the light emitting EL does not easily enter the insulating bank BANK but is reflected on an interface between the insulating bank BANK and the organic EL layer OLED.

Third Embodiment

Figure 13:
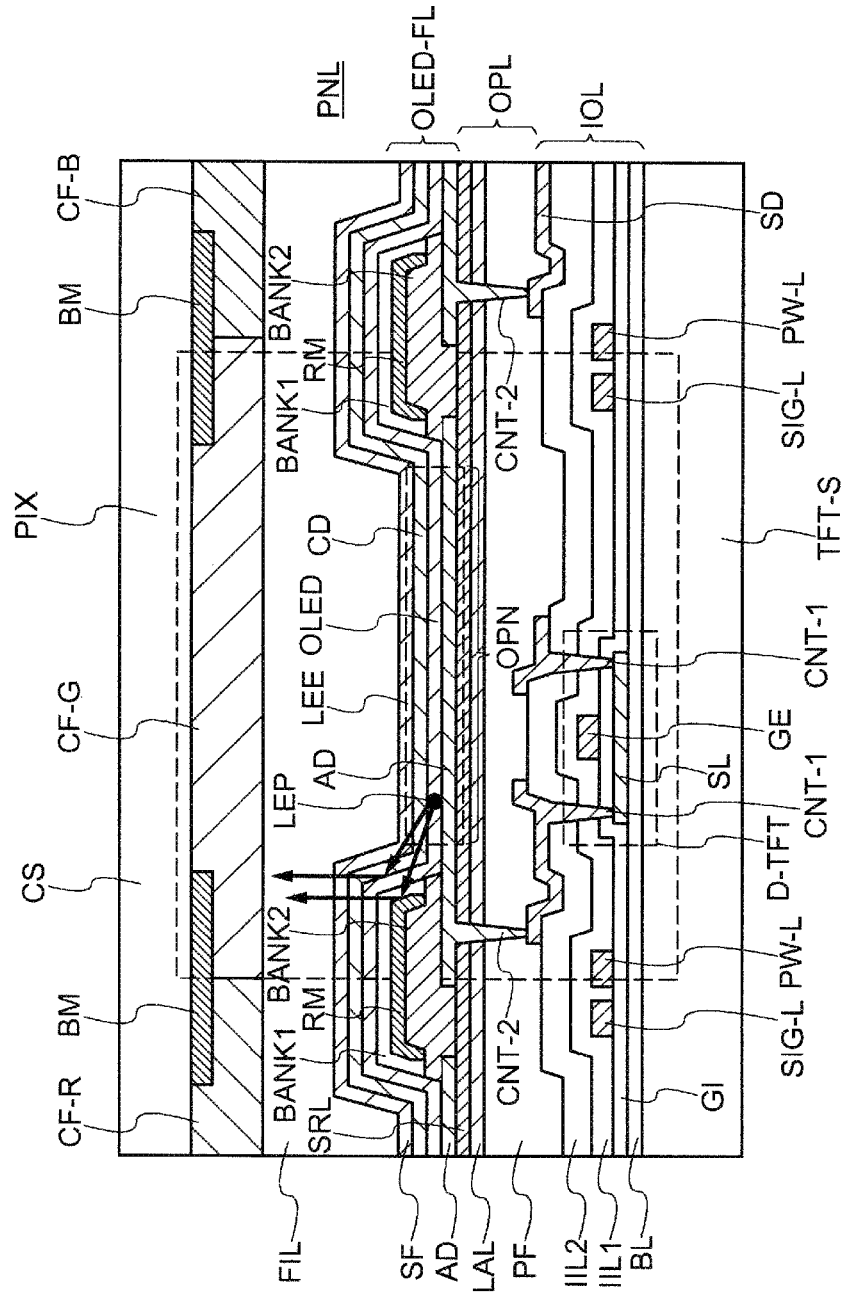
FIG. 13 is a cross-sectional view of a pixel in a display device according to an embodiment of the present invention.

FIG. 13 is a schematic sectional view of a pixel PIX in a display device. An insulating bank is changed to an insulating bank BANK1, a reflection metal RM inside thereof, and an insulating bank BANK2 inside thereof. An end of a black matrix BM may be made to match a boundary between a flat portion (apex) of the insulating bank BANK2 and an inclined plane. Thus, among light emitting ELs from a light emitting point LEP, not only the light emitting EL, which is reflected on a boundary between the insulating bank BANK1 and an organic EL layer OLED and extracted outward, but also the light emitting EL, which is reflected on a boundary between the reflection metal RM and the insulating bank BANK1 and extracted outward, can be effectively utilized. When the reflection metal RM is used, the light emitting EL can be reliably reflected, and can be more effectively extracted. In the second embodiment, the reflection on the boundary between the organic EL layer and the insulating bank BANK cannot be effectively utilized because the light emitting EL enters the insulating bank BANK depending on its angle of incidence. However, that is not the case in the present embodiment. Any insulator is sandwiched between the reflection metal RM and an anode AD so that a lower end of the reflection metal RM does not contact the anode AD. This is because when the reflection metal RM and the anode AD contact each other, a short occurs between the anode AD and an adjacent anode AD. Not the lower end but an apex of the reflection metal RM may be cut to prevent a short from occurring between the adjacent anodes AD. When structures in the embodiments 2 and 3 are used, light reflected on the selective reflection layer SRL can be extracted outward when effectively reflected on the insulating bank BANK and the reflection metal RM.

Fourth Embodiment

Figure 14:
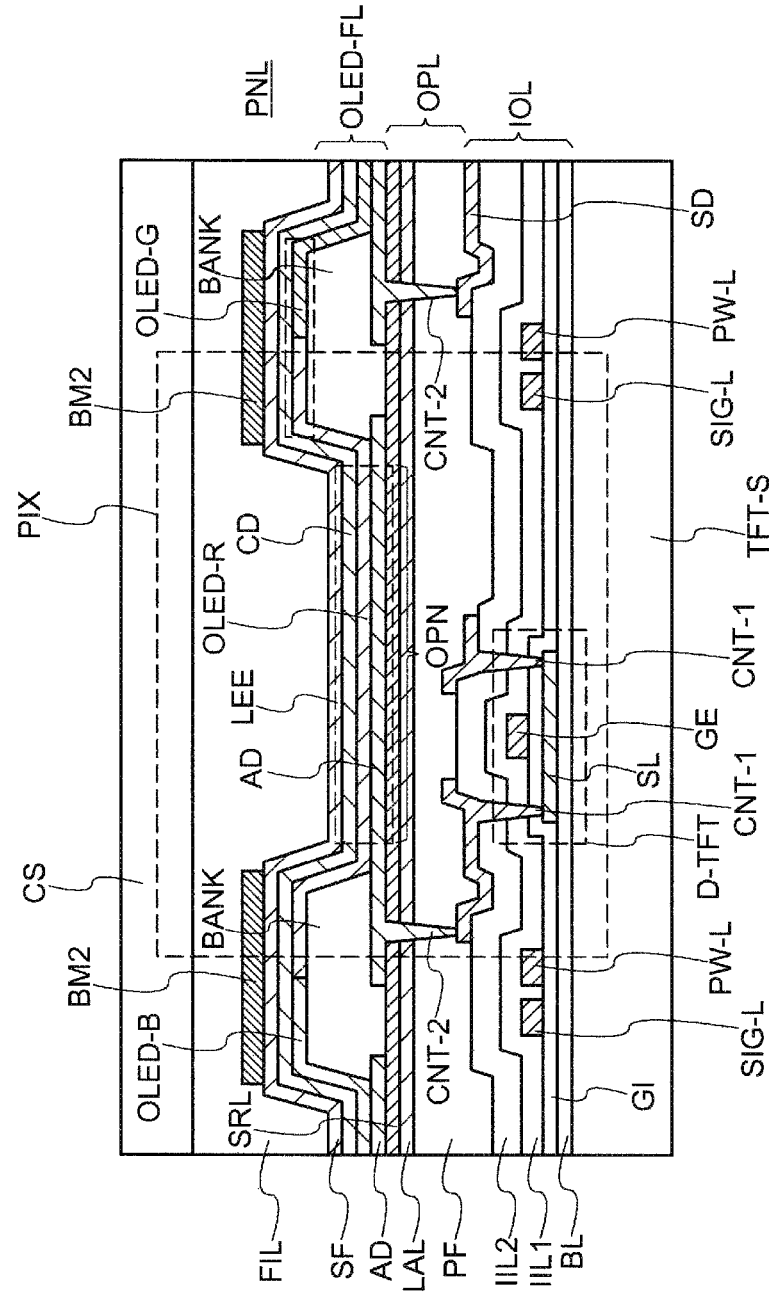
FIG. 14 is a cross-sectional view of a pixel in a display device according to an embodiment of the present invention.

FIG. 14 is a schematic sectional view of a pixel PIX in a display device. A color filter layer CF-FL does not exist. Further, an organic EL layer includes an organic EL layer OLED-B which emits blue light, an organic EL layer OLED-R which emits red light, and an organic EL layer OLED-G which emits green light for each pixel PIX. A black matrix BM2 is arranged between a sealing film SF just above an insulating bank BANK and a filling layer FIL. An organic EL boundary section OLED-D is in an organic EL layer on the insulating bank BANK, and is a boundary between the organic EL layers for colors. In the boundaries, respective light emitting layers EML in the organic EL layers are at least separated, and the different light emitting layers EML are respectively used for the organic EL layers.

Thus, the organic EL layers are respectively painted in red, blue, and green. Therefore, an optical color mixture does not exist in principle. Therefore, it may seem that the black matrix BM2 need not exist. However, the black matrix BM2 may as well exist in the present embodiment. If a circular polarizing plate is not used and the black matrix BM2 does not exist, outside light with which a contact CNT2 has been illuminated is feared to be reflected. The contact CNT2 is not covered with a light absorption layer LAL. Moreover, the contact CNT2 has an engraved shape. Therefore, it is not found how the outside light with which the contact CNT2 has been illuminated is reflected outward. Thus, the black matrix BM2 is to cover at least the contact CNT2.

Fifth Embodiment

Figure 15:
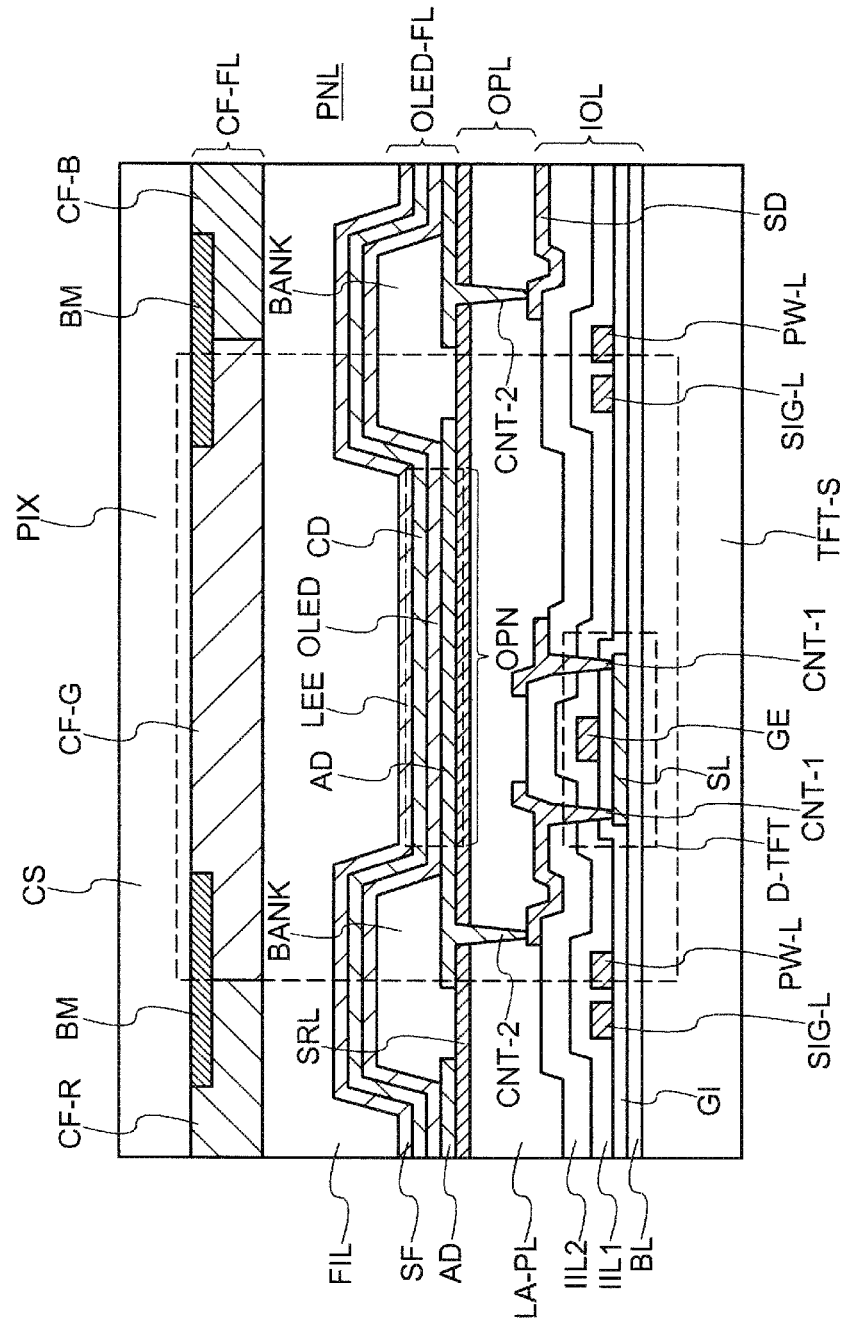
FIG. 15 is a cross-sectional view of a pixel in a display device according to an embodiment of the present invention.

FIG. 15 is a schematic sectional view of a pixel PIX in a display device. Instead of the planarizing film PF and the light absorption layer LAL, a light absorption planarizing layer LA-PL having both their functions is provided. The light absorption planarizing layer LA-PL is a layer colored by mixing a coloring pigment with resin such as acrylic or epoxy, and black is mainly used as the coloring pigment. The coloring pigment may be a material having low visibility such as blue. Further, the light absorption planarizing layer LA-PL may be formed by mixing a coloring dye such as black with resin, or may be formed by mixing a coloring material such as carbon block or titanium black with resin. In addition, chromium may be used as the light absorption planarizing layer LA-PL. However, in the case, an insulating layer needs to be sandwiched between the light absorption planarizing layer LA-PL and an electrode coming in contact therewith, for example, to ensure an insulating property therebetween. The thickness of the light absorption planarizing layer LA-PL is set to 3 to 5 µm. The light absorption planarizing layer LA-PL cannot sufficiently cover and planarize an underlying structure if the thickness thereof is smaller than 3 µm, and a formation period of time is lengthened if the thickness thereof is larger than 5 µm. When an optical layer OPL is thus formed, manufacturing processes can be simplified.

Sixth Embodiment

Figure 16:
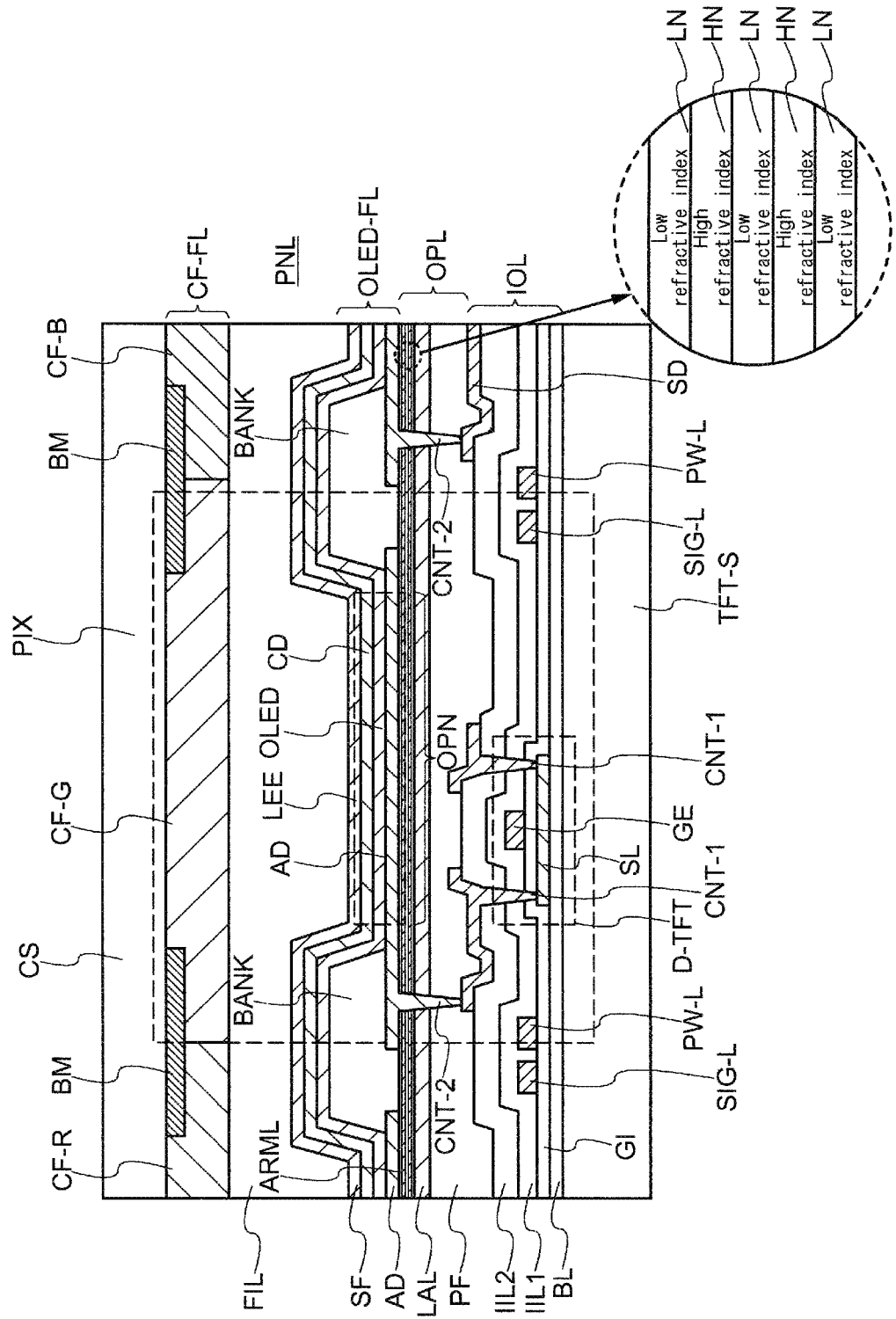
FIG. 16 is a cross-sectional view of a pixel in a display device according to an embodiment of the present invention.

FIG. 16 is a schematic sectional view of a pixel PIX in a display device. Instead of the selective reflection layer SRL, an antireflection multi-layer film ARML is provided. Outside light OL having a reflectivity of 5% or less is generally reflected on an interface between an anode AD and the selective reflection layer SRL, causing outside light reflection. When the antireflection multi-layer film ARML is formed instead of the selective reflection layer SRL, outside light reflection is more effectively suppressed. The antireflection multi-layer film ARML has a shape in which low refractive index films LN and high refractive index films HN are alternately stacked. The low refractive index film LN is similar in material and refractive index to the aforementioned selective reflection layer SRL. A material for the high refractive index film HN is a silicon nitride film, a titanium oxide film, and a zirconium oxide film, and its refractive index is 1.7 to 2.5. When the thickness of the antireflection multi-layer film ARML is designed in a range of 100 nm to 1000 nm so that light reflected on an interface between the low refractive index film LN and the high refractive index film HN and light reflected on an interface between the high refractive index film HN and the low refractive index film LN optically cancel each other, the reflectivity decreases.

Ideally, the more the number of layers in the antireflection multi-layer film ARML is, the more preferable the antireflection multi-layer film is, although an effect is produced from a set of low and high refractive index films LN and HN.

Seventh Embodiment

Figure 17:
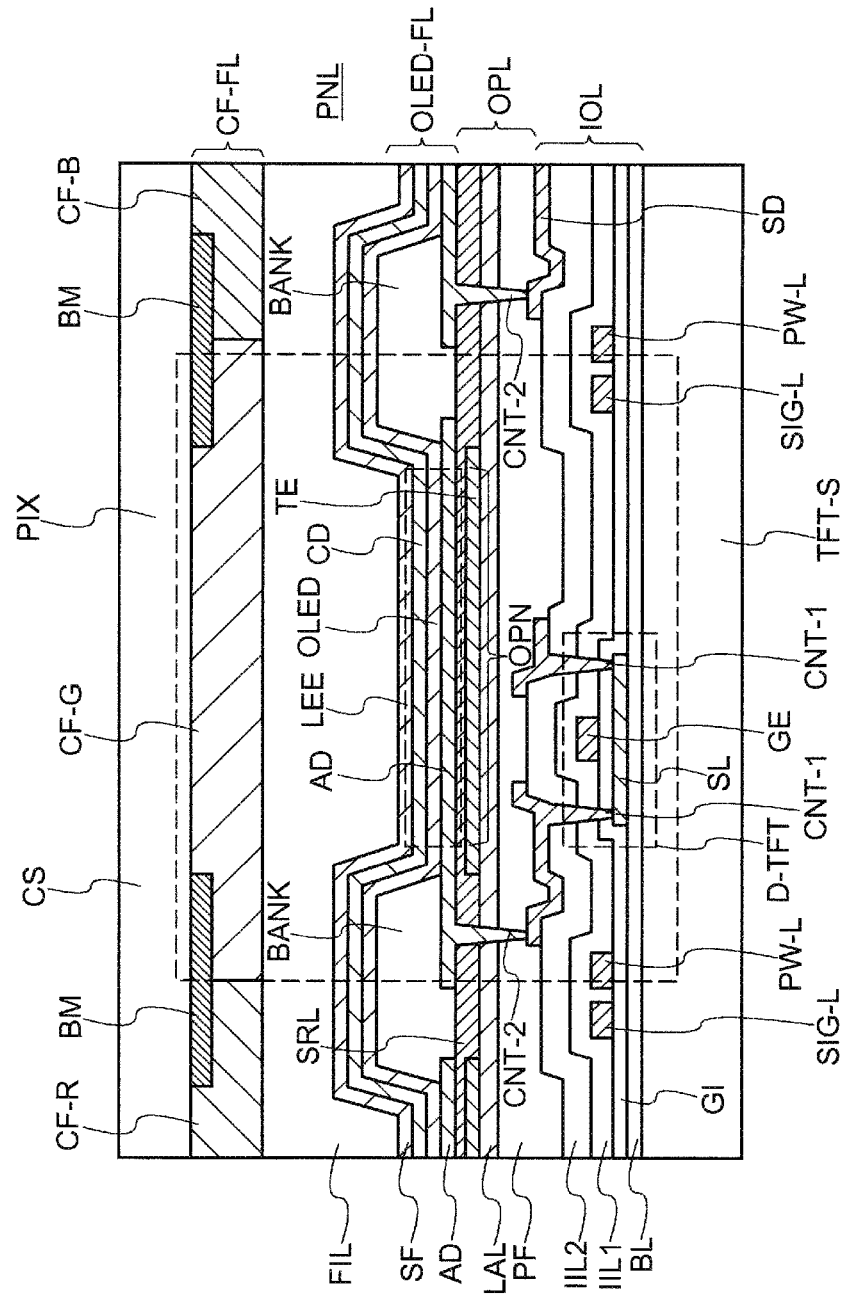
FIG. 17 is a cross-sectional view of a pixel in a display device according to an embodiment of the present invention.

FIG. 17 is a schematic sectional view of a pixel PIX in a display device. A transparent electrode TE is further provided between a selective reflection layer SRL and a light absorption layer LAL. The transparent electrode TE vertically transmits light, and a material for the transparent electrode TE is similar to that for an anode AD. The transparent electrode TE, the anode AD, and the selective reflection layer SRL between the transparent electrode TE and the anode AD constitute a capacitive element CAP. The area of the anode AD in the capacitive element CAP increases if the transparent electrode TE is extended to a site excluding the vicinity of a contact CNT2. However, if a low refractive index material, like the selective reflection layer SRL, is used, a dielectric constant generally decreases. Thus, a capacitive value of the capacitive element CAP may not be so large. Thus, if the capacitance value of the capacitive element CAP is desired to be further increased, a capacitive element may also be provided in another layer, or a film having a high dielectric constant such as a silicon nitride film may be further sandwiched between the transparent electrode TE and the anode AD. When this transparent electrode TE is thus used, a region below the anode AD can be effectively used for a pixel circuit, leading to a reduction in layout.

Eighth Embodiment

Figure 18:
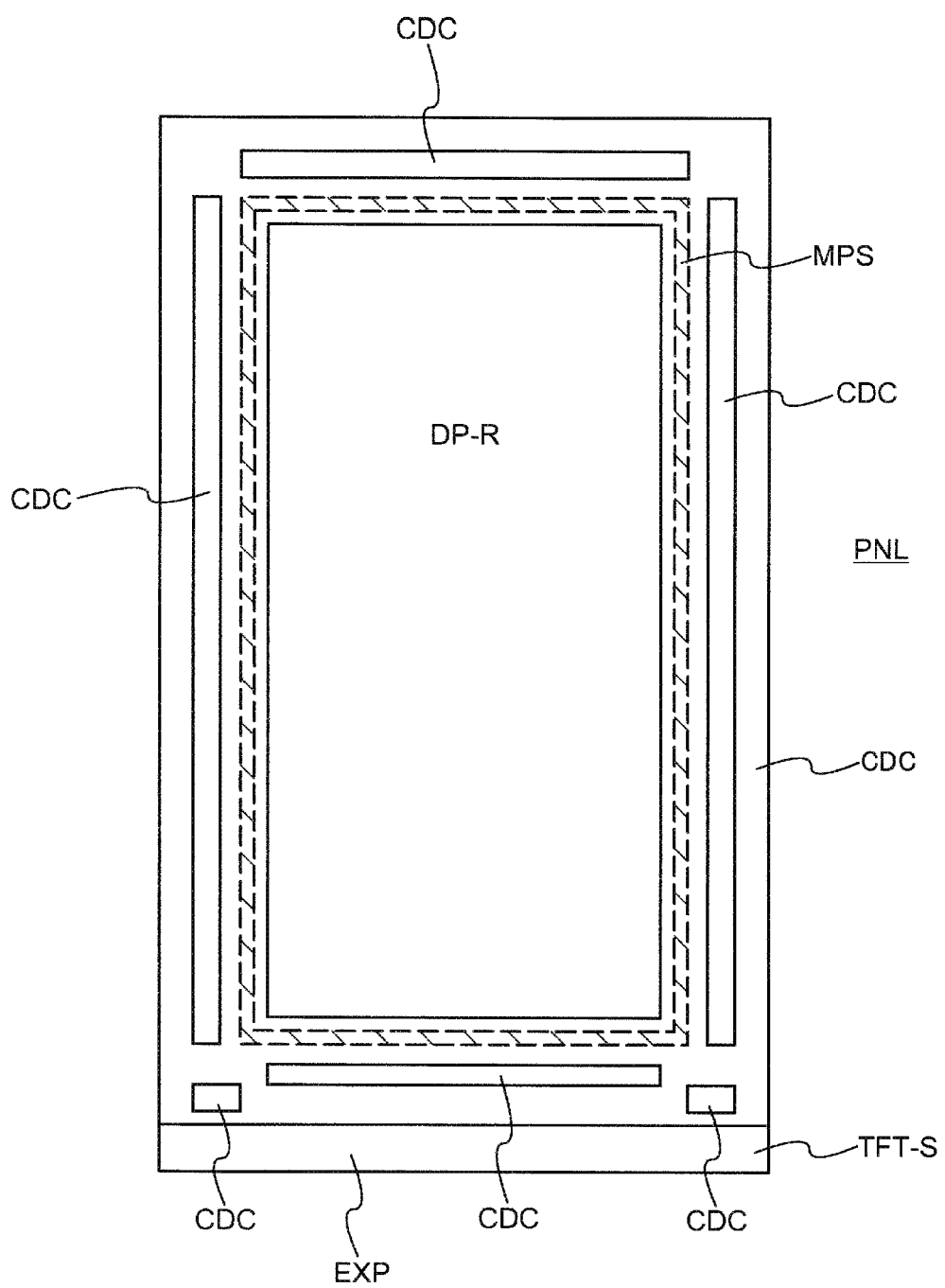
FIG. 18 is a plan view of a display panel in a display device according to an embodiment of the present invention.
Figure 19:
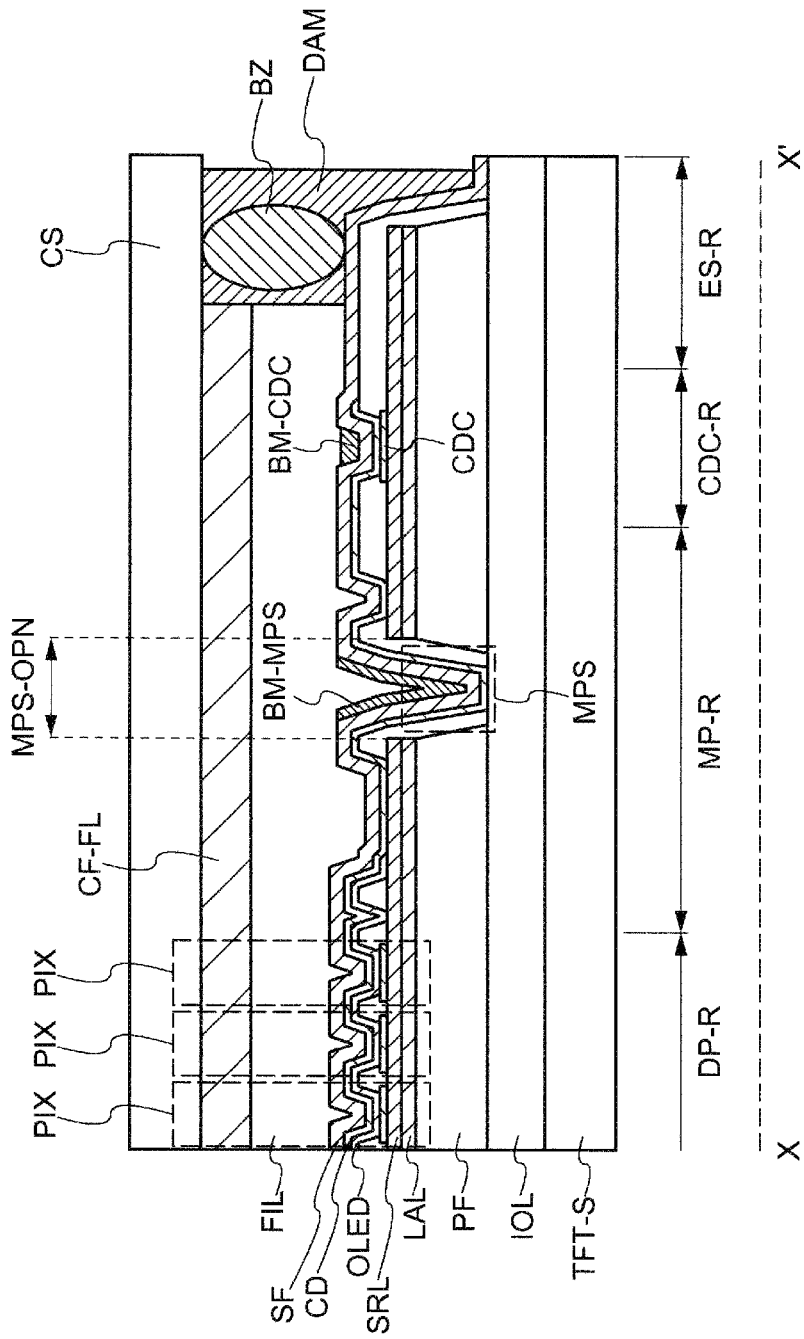
FIG. 19 is a cross-sectional view of an end of the display panel in the display device according to the embodiment of the present invention.

FIG. 18 is a plan view of a display panel PNL. FIG. 19 is a cross-sectional view corresponding to a cross section taken along a line X-X' of the display device PNL. A moisture prevention structure MPS is provided to surround a display region DP-R in the display panel PNL. Cathode contacts CDC are respectively provided outside the moisture prevention structure MPS in shapes along the four sides of a counter substrate CS. Cathode contacts CDC are also respectively provided in the vicinities of two corners of the counter substrate CS which are close to an exposure region EXP.

A plurality of pixels PIX are arranged in the display region DP-R, as illustrated in FIG. 19. A moisture prevention region MP-R is arranged on the side closer to X' than the display region DP-R. The moisture prevention region MP-R includes a moisture prevention structure MPS, in which an organic layer IOL and a cathode CD contact each other. Another inorganic layer may be inserted therebetween. When the moisture prevention structure MPS is thus provided, a substance, which adversely affects an organic EL layer OLED, such as water or oxygen, does not enter the display region DP-R from the outside. In providing the moisture prevention structure MPS, a planarizing film PF is removed, and a light absorption layer LAL and a selective reflection layer SEL are also removed. An opening obtained by removing the layers is a moisture prevention structure opening MPS-OPN. When outside light OL is incident, to reach the inorganic layer IOL while the light absorption layer LAL does not exist, various types of elements within the inorganic layer IOL are illuminated with the outside light OL, causing outside light reflection and a malfunction of a TFT. Therefore, a black matrix BM-MPS is provided on a sealing film SF in a shape corresponding to at least the moisture prevention structure opening MPS-OPN. This can prevent the outside light reflection and the malfunction of the TFT, as described above.

A cathode contact region CDC-R exists on the side closer to X' than the moisture prevention region MP-R. A cathode contact CDC at this site is a structure for reducing a cathode resistance to avoid a rise in voltage of the cathode CD when a display operation is performed. The cathode contact CDC has a predetermined wiring structure, is provided on the selective reflection layer SRL, and is connected to the cathode CD. The cathode contact CDC is formed of a similar material to that for a gate electrode GE. Thus, when the outside light OL is incident on the cathode contact CDC, the outside light OL is reflected. Therefore, the black matrix BM-CDC is provided to prevent the reflection.

A sealing region ES-R exists on the side closer to X' than the cathode contact region CDC-R. At an end of a TFT substrate TFT-S in the sealing region ES-R, the planarizing film PF, an insulating bank BANK, and the like are removed, and a sealing film SF and the inorganic layer IOL contact each other, to prevent water, oxygen, or the like from entering the TFT substrate TFT-S from the outside. A seal DAM exists on the sealing film SF, a plurality of beads BZ are provided within the seal DAM to keep a distance between the counter substrate CS and the TFT substrate TFT-S constant, and the beads BZ contact the sealing film SF and the counter substrate CS. While the black matrix BM-MPS and the black matrix BM-CDC are respectively individually provided at required sites in the present embodiment, a black matrix extending over the moisture prevention region MP-R, the cathode contact region CDC-R, and the sealing region ES-R may be provided.

It should be understood that the embodiments disclosed in the present specification are exemplary in all respects and not restrictive. The scope of the present invention is described not in the aforementioned sense but by the claims, and is intended to include all alterations within a sense and a range equivalent to those in the claims. Respective technical features described in the embodiments can be mutually combined, and a new technical feature can be formed by their combination. For example, a form in which a technical thought set forth in any one of the embodiments 6 to 8 is added to a technical thought set forth in any one of the embodiments 1 to 5 is also included in a technical thought of the present invention.

What is claimed is:
1. A display device comprising:
   a first substrate;
   a coloring layer formed on the first substrate;
   a transparent insulating layer having a first refractive index formed on the coloring layer;
   a first transparent electrode having a second refractive index higher than the first refractive index formed on the transparent insulating layer;
   an organic layer having a light emitting layer formed on the first transparent electrode; and
   a second transparent electrode formed on the organic layer,
   wherein
   the coloring layer includes a black carbon pigment,
   an upper surface of the coloring layer is in contact with the transparent insulating layer,
   an upper surface of the transparent insulating layer is in contact with the first transparent electrode, and
   each of the coloring layer and the transparent insulating layer includes an epoxy material or an acrylic resin.

2. The display device according to claim 1, further comprising a plurality of pixels arranged in a matrix shape and each including the coloring layer, the transparent insulating layer, the first transparent electrode, the organic layer, and the second transparent electrode on the first substrate, wherein each of the plurality of pixels further includes a light emitting element overlapping the first transparent electrode in a region being in contact with the organic layer in a planar view and including the first transparent electrode, the organic layer, and the second transparent electrode, and a thin film transistor is arranged between the coloring layer and the first substrate to overlap the light emitting element in the planar view.

3. The display device according to claim 2, further comprising:

a moisture prevention structure provided to surround the plurality of pixels, in which the second transparent electrode and an inorganic layer having the thin film transistor formed therein contact each other and the coloring layer and the transparent insulating layer do not exist, a conductive layer provided along the moisture prevention structure, connected to the second transparent electrode, and provided on the coloring layer, and a black matrix covering at least the moisture prevention structure and the conductive layer.

4. The display device according to claim 1, wherein
  an insulating bank is arranged between the organic layer and the first transparent electrode to cover an end of the first transparent electrode,
  the insulating bank has a refractive index lower than that of the first transparent electrode,
  a black matrix is arranged in a region overlapping the insulating bank in a planar view, and
  the insulating bank has an inclined plane and a flat portion, and is at a position where an intersection between the inclined plane and the flat portion and an end of the black matrix overlap each other in the planar view.

5. The display device according to claim 1, wherein
  a first insulating bank is arranged between the organic layer and the first transparent electrode to cover an end of the first transparent electrode,
  the first insulating bank has a refractive index lower than that of the first transparent electrode,
  a reflection film formed of a metal is provided inside the first insulating bank,
  a second insulating bank is provided inside the reflection film,
  a black matrix is arranged in a region overlapping the reflection film in a planar view, and
  the reflection film has an inclined plane and a flat portion, and is at a position where an intersection between the inclined plane and the flat portion and an end of the black matrix overlap each other in the planar view.

* * * * *